United States Patent
Cremonesi et al.

(10) Patent No.: US 6,180,460 B1
(45) Date of Patent: Jan. 30, 2001

(54) PROCESS FOR MANUFACTURING OF A NON VOLATILE MEMORY WITH REDUCED RESISTANCE OF THE COMMON SOURCE LINES

(75) Inventors: Carlo Cremonesi, Vaprio d'Adda; Federico Pio, Brugherio; Nicola Zatelli, Bergamo, all of (IT)

(73) Assignee: STMicroelectronics S.r.l., Agrate Brianza (IT)

( * ) Notice: Under 35 U.S.C. 154(b), the term of this patent shall be extended for 0 days.

(21) Appl. No.: 09/337,051

(22) Filed: Jun. 21, 1999

(30) Foreign Application Priority Data

Jun. 25, 1998 (IT) .............................................. MI98A1449

(51) Int. Cl.[7] .............................................. H01L 21/8247
(52) U.S. Cl. .......................................... 438/264; 438/279
(58) Field of Search .................................... 438/257–267, 438/279

(56) References Cited

U.S. PATENT DOCUMENTS

| | | | |
|---|---|---|---|
| 5,661,057 | * 8/1997 | Fujiwara | 438/257 |
| 5,966,602 | * 10/1999 | Kawazu et al. | 438/258 |
| 5,998,262 | * 12/1999 | Chen | 438/257 |
| 6,013,551 | * 1/2000 | Chen et al. | 438/264 |
| 6,013,574 | * 8/2000 | Iwasaki | 438/257 |
| 6,071,779 | * 6/2000 | Mehrad et al. | 438/262 |
| 6,103,577 | * 8/2000 | Horng | 438/262 |

* cited by examiner

Primary Examiner—Richard Booth
(74) Attorney, Agent, or Firm—Wolf, Greenfield & Sacks, P.C.

(57) ABSTRACT

Process for manufacturing a non-volatile memory with memory cells arranged in rows and columns in a matrix structure, with source lines extending in parallel with and intercalated to said rows, the cells including MOS transistors having a floating gate and a control gate respectively formed in a first and a second polysilicon layers superimposed, the process including a first step of definition of regions of active area covered by a layer of thin oxide and delimited by regions of field oxide, a second step of deposition of the first polysilicon layer, a third step of etch of the first polysilicon layer through a first mask to separate the floating gates of cells belonging to a same row of the matrix, a fourth step of deposition of an intermediate dielectric layer and of the second polysilicon layer, a fifth step of definition of the rows through self-aligned selective etch of said second polysilicon layer, of the intermediate dielectric layer and of the first polysilicon layer, the self-aligned selective etch determining in the source lines excavations in correspondence of regions in which the first polysilicon layer has been removed during the third step, and a sixth step of dopant introduction in the regions of active area for the formation of regions of source and drain of the cells. Before the fourth step a selective introduction of dopant is provided in correspondence of regions of the common source lines in which the excavations will be formed, for the formation of doped regions deeper than the excavations.

7 Claims, 5 Drawing Sheets

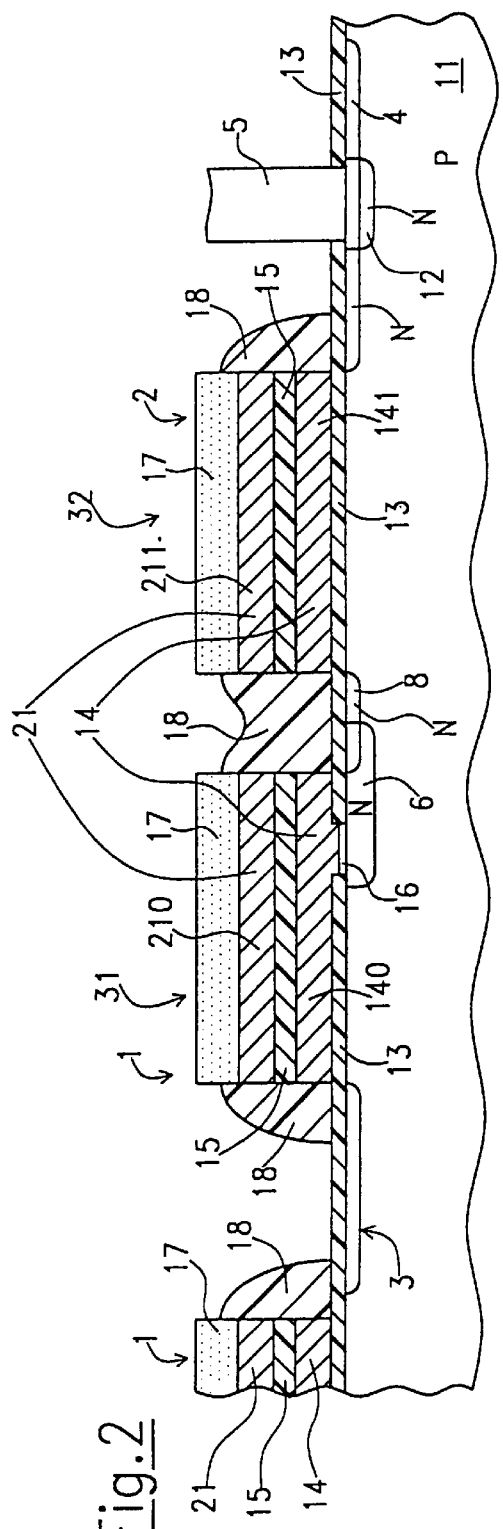
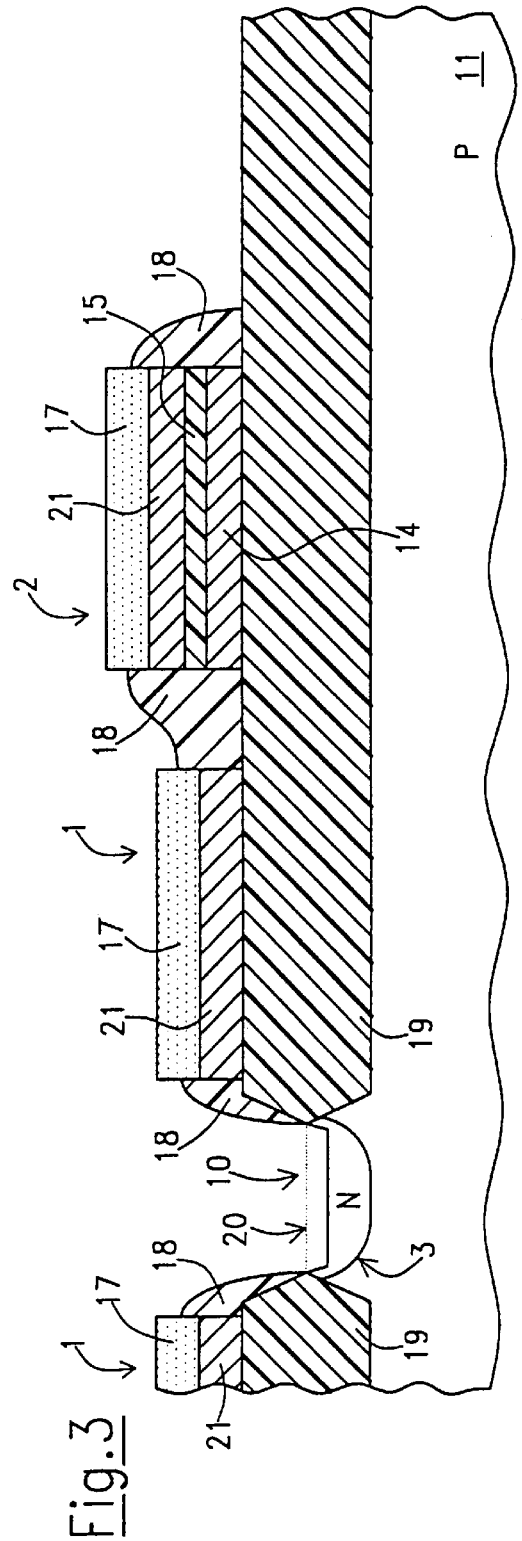

PROCESS FOR MANUFACTURING OF A NON VOLATILE MEMORY WITH REDUCED RESISTANCE OF THE COMMON SOURCE LINES

BACKGROUND OF THE INVENTION

1. Field of the Invention

The present invention relates to a process for manufacturing a non volatile memory, particularly a memory of the EPROM, EEPROM or Flash EEPROM type with a double layer of polycrystalline silicon, in standard or AMG (Alternate Metal Ground) configuration. More particularly, the invention relates to a process that reduces the resistance of the common source lines in the matrix of memory cells.

2. Discussion of the Related Art

In matrixes of self-aligned cells, present in EEPROM, EPROM and Flash EEPROM non-volatile memories with double layer of polycrystalline silicon, in standard or AMG configuration, the common source lines have, at the end of the manufacturing process, deep silicon excavations (for instance of depth equal to 2500 Å) in particular zones of active area, more precisely in the zones where the lower polysilicon layer is etched and removed during the step of isolation of the floating gates of the memory cells belonging to a same row ("word line") of the matrix.

In fact, during a conventional manufacturing process for a matrix of non-volatile memory cells, for instance of the EEPROM type, after having defined the zones of active area, covered by a thin layer of oxide (gate oxide), and the zones of field oxide, a first layer of polycrystalline silicon or polysilicon is deposited on the whole surface of the wafer and then, through a suitable mask, the first polysilicon layer is etched to form regions of lower polysilicon along the active areas.

During the aforesaid phase of etching the first polysilicon layer, zones of active area are created that are no longer covered by the first polysilicon layer: these zones will be those in which the aforesaid deep excavations will subsequently be formed.

Once the aforesaid regions of lower polysilicon have been defined, an intermediate dielectric layer (for instance ONO) is grown on the whole surface of the wafer and then, through deposition of a second polysilicon layer and following selective etch, seconds strips of upper polysilicon, superimposed on and transverse to the aforesaid regions of lower polysilicon are defined, that constitute the word lines.

At this step, the intermediate dielectric is etched in self-aligned manner with the strips of upper polysilicon, and during this phase the gate oxide present on the zones of active area that are no longer covered by the lower polysilicon is also etched, leaving the underlying silicon uncovered.

In the following etching phase of the lower polysilicon, also this time self-aligned with the intermediate dielectric and the upper polysilicon, for the definition of the self-aligned cells, the aforesaid zones of active area, no longer covered by the lower polysilicon or by gate oxide, are etched and therefore excavations in the uncovered silicon are formed.

The presence of these excavations results in, during the following LDD etch, the formation of narrow spacers of oxide on the walls of the same excavations, of extremely varying width, that may screen, in an undesired way, the N+ implant of source and drain of the memory cells that follows.

In FIG. 1 there is for instance shown a cell 30 of a non-volatile memory matrix of the EEPROM type, and in the FIGS. 2 and 3 there are shown the cross-sections of the cell 30 along the lines II—II and III—III, respectively.

The memory cell 30 includes a floating gate transistor 31, a selection transistor 32, an N type drain region 4 with respective external contact 5 and a source region, included in an N type common source line 3. The floating gate transistor 31 includes, in turn, a floating gate 140 and a superimposed control gate 210, this last associated with a row or word line 1 of the matrix, and a layer of intermediate oxide 15 among the two aforesaid gates. The selection transistor 32 also includes two gates, respectively the gate 141 and the gate 211, superimposed and short-circuited externally to the matrix, and is associated with a selection line 2, parallel to the row 1 of the memory matrix. Among the floating gate transistor 31 and the selection transistor 32, along the active area, an N type region 8 is provided, while on the thin gate oxide layer (typically of thickness ranging between 150 and 300 Å), underlying the floating gate 140, an even thinner portion of oxide 16 is present (tunnel oxide, typically of thickness ranging between 70 and 120 Å), under which an N type region 6 is implanted, through a special mask 7, to allow the passage of the electrons for tunnel effect from the drain to the floating gate, and viceversa, when the information is stored in the memory cell.

In FIG. 1 are also visible (in dashed line) the windows of a photolithographic mask 9, used in the initial etch of a lower polysilicon layer 14 for the definition of the floating gates 140 and (in dash-and-dot line) a window of a photolithographic mask 7 used for the dopant implant under the tunnel oxide 16.

In FIG. 2 the section II—II of FIG. 1 is shown: on a P type substrate 11 a thin gate oxide layer 13 is present through which N type implants are performed for the source and drain regions 3, 4, as well as for the region 8 forming both the drain electrode of the floating gate transistor 31 and the source electrode of the selection transistor 32.

Also visible are the N type deep region 6 under the tunnel oxide 16, and an N type region 12, also deep, in correspondence to the external drain contact 5.

Both the floating gate transistor 31 and the selection transistor 32 are formed by a first polysilicon layer 14 (lower polysilicon), an intermediate dielectric layer 15 and a second polysilicon layer 21, on which a layer of salicide 17 can optionally be defined. Also visible are the spacers of oxide 18 on the walls of the gates.

FIG. 3 shows the cross-section III—III of FIG. 1, in which the two gates are present above a thick field oxide layer 19. Thanks to the mask 9, used in the initial etch of the lower polysilicon for the definition of the gates, the row 1 of the matrix results composed of only two layers, the upper polysilicon layer 21 and the salicide layer 17, and besides the region of common source 3 has an excavated zone 10 (in figure there is also shown in dot line the profile 20 of the source region 3 before that, during the etch that defines the words line, silicon is excavated). As in FIG. 2, the spacers 18 are visible, whose width can create problems of masking of the excavated regions 10 during the following N type implant for the formation of the drains and the sources, particularly of the common source lines 3.

The elimination or the reduction of the width of the spacers 18 on the walls of the excavations 10 are not feasible since their formation depends on the inherent misalignment in the lithographic process and on the natural variability of the LDD etch process.

Besides, in the most advanced process, the diffusions of source and drain are very thin and therefore in correspondence to the aforesaid excavations 10, where a considerable gradient is present, there is obtained a narrowing of the diffusion and consequently the resistance of the source line 3 can be very elevated (as well as varying from lot to lot due to the process variations). As can be noticed in FIG. 4, that shows the section IV—IV of FIG. 1 along the common source line 3, along the source line problems of connection between excavated regions 10 and non-excavated regions can be experienced.

In view of the state of the art described, the object of the present invention is that of providing a process of manufacturing that allows decreasing the resistance of the common source line of a matrix of self-aligned non-volatile memory cells.

SUMMARY OF THE INVENTION

According to the present invention, this and other objects are achieved by a process for the manufacture of a non volatile memory with memory cells arranged in rows and columns in a matrix structure, with source lines extending in parallel with and intercalated to said rows, said cells comprising MOS transistors having a floating gate and a control gate respectively formed in a first and a second polysilicon layer superimposed, said process including a first step of definition of regions of active area covered by a layer of thin oxide and delimited by regions of field oxide, a second step of deposition of said first polysilicon layer, a third step of etch of said first polysilicon layer through a first mask to separate the floating gates of cells belonging to a same row of the matrix, a fourth step of deposition of an intermediate dielectric layer and of said second polysilicon layer, a fifth step of definition of said rows through self-aligned selective etch of said second polysilicon layer, of said intermediate dielectric layer and of said first polysilicon layer, said self-aligned selective etch determining in said source lines excavations in correspondence of regions in which the first polysilicon layer has been removed during said third step, and a sixth step of dopant introduction in said regions of active area for the formation of regions of source and drain of said cells, characterized in that before said fourth step a selective introduction of dopant is provided in correspondence of regions of said common source lines in which said excavations will be formed, for the formation of doped regions deeper than said excavations.

As a result of the present invention it is possible to realize, simply through a preliminary implant in the regions of the source lines that will be excavated, a diffusion whose depth is greater than that of the final excavation in said regions, that guarantees electric continuity and low resistance along the source lines.

BRIEF DESCRIPTION OF THE DRAWINGS

The features and advantages of the present invention will be made evident by the following detailed description of two practical embodiments thereof, illustrated by way of non-limiting examples in the enclosed drawings, in which:

FIG. 2 shows the cross-section along line II—II of FIG. 1;

FIG. 3 shows the cross-section along line III—III of FIG. 1;

DETAILED DESCRIPTION

Figure 6:
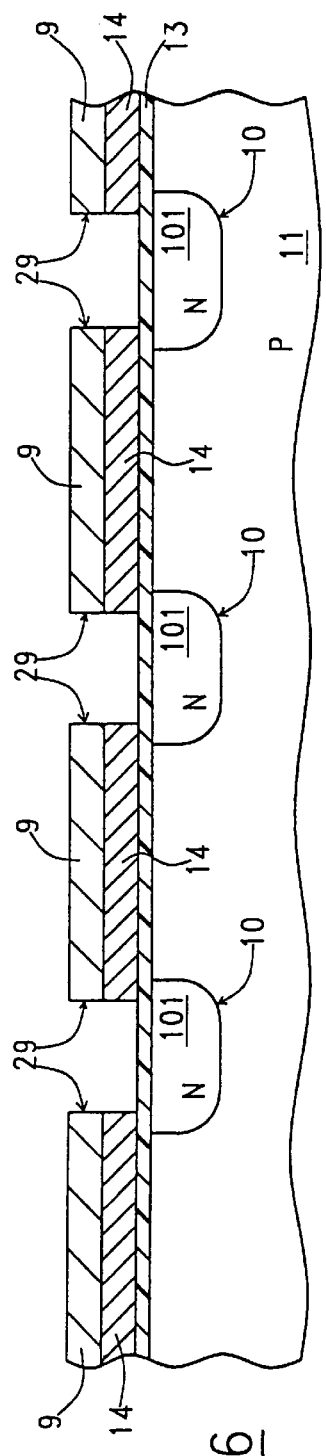
FIG. 6 shows the cross-section along line VI—VI of FIG. 5.
Figure 5:
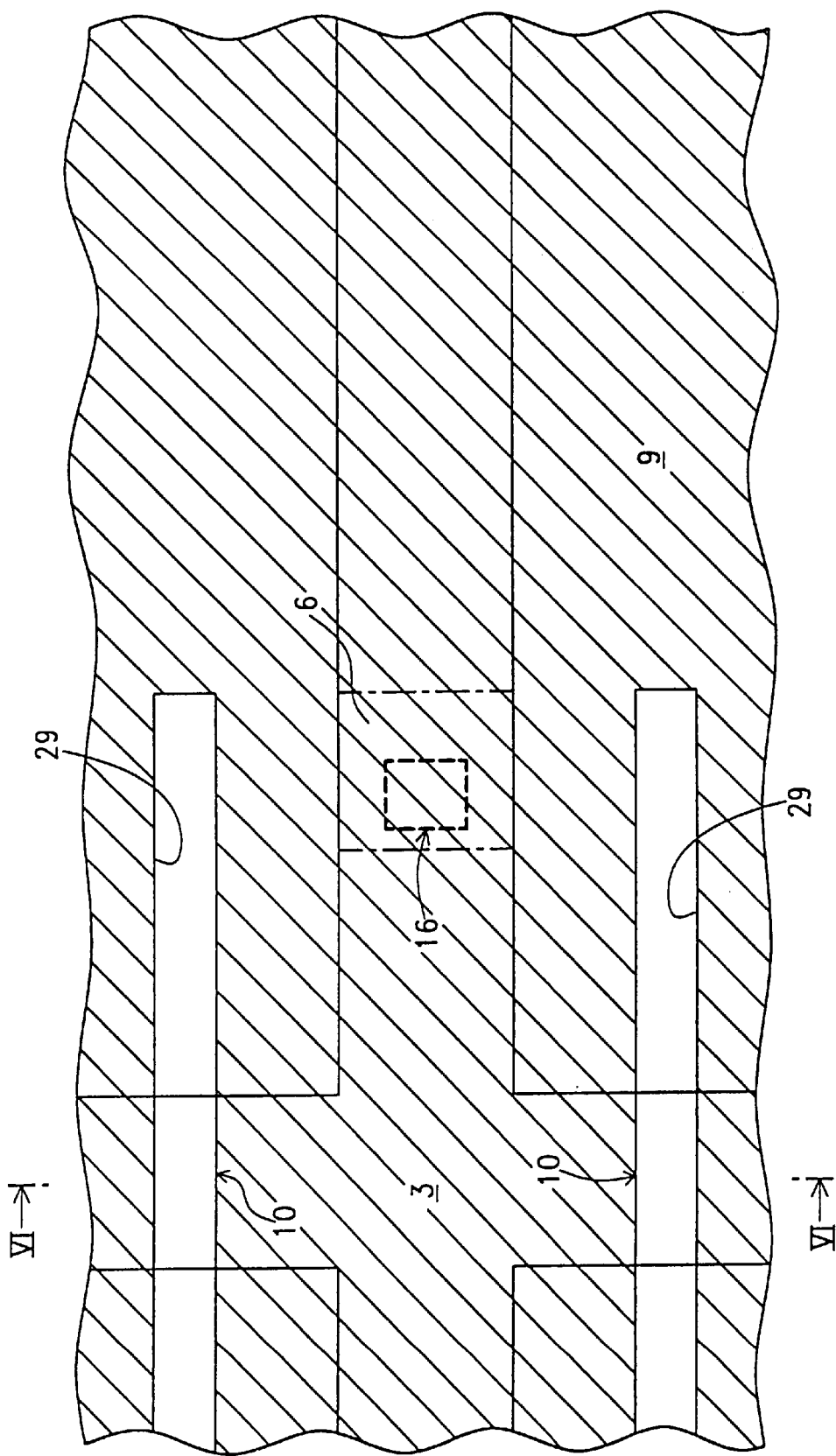
FIG. 5 shows in top-plan of a cell of a matrix of an EEPROM type memory after the first etch of the lower polysilicon layer and the deep N type implant, according to a first embodiment of the present invention.

A first embodiment of the present invention exploits the same photolithographic mask 9 used for the first etch of the lower polysilicon layer 14 for the isolation of the floating gates 1 of adjacent memory cells: with reference to the FIG. 5, after having etched the lower polysilicon layer 14, that is therefore removed also from the zones of active area 10 in which the windows t29 of the aforesaid mask 9 are present, an N type dopant implant is performed (for instance phosphorus or arsenic in a dose of about $5*10^{14}$ atoms/cm$^2$ and with an energy of about 80 KeV) so to form in the zones 10 deep N type regions 101, as shown in FIG. 6. In this way, when during the following self-aligned etch for the definition of the word lines excavations in the zones 10 will be formed, the presence of the aforesaid deep regions 101 will guarantee the electric continuity of the source line.

Figure 7:
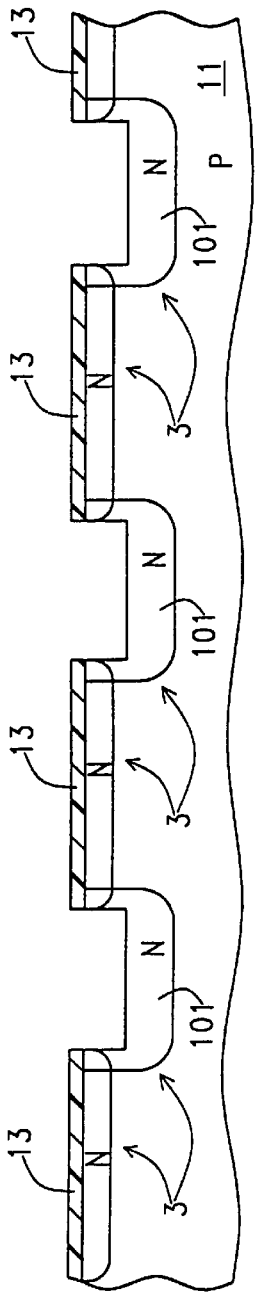
FIG. 7 shows the same section of FIG. 6 after the implant of source and drain, according to the present invention.

This is schematically shown in FIG. 7, showing the same section of FIG. 6, along a common source line 3, after the N type source and drain implant.

Figure 1:
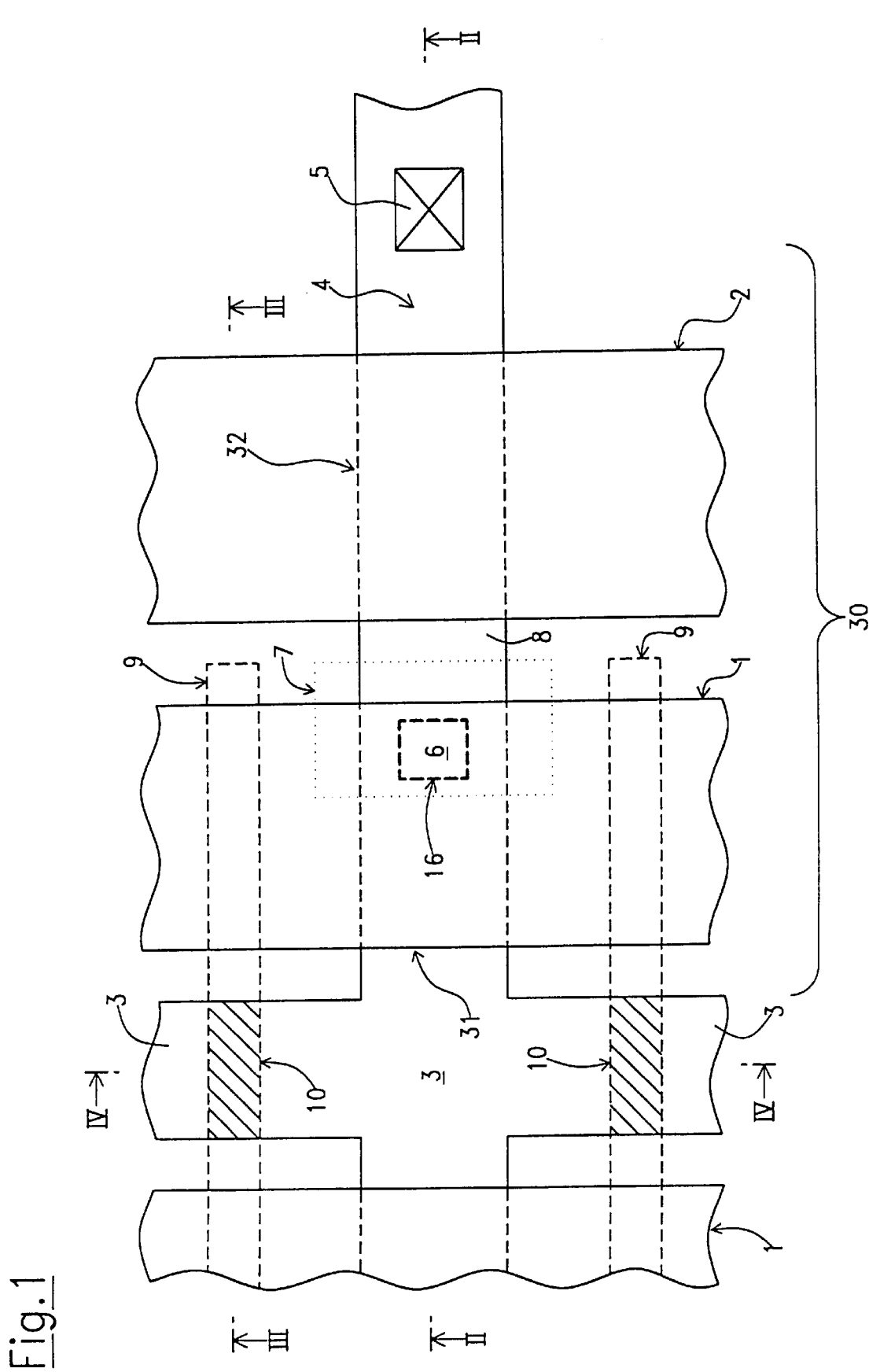
FIG. 1 shows in top-plan a cell of a non-volatile memory matrix of EEPROM type, according to the prior art.
Figure 4:
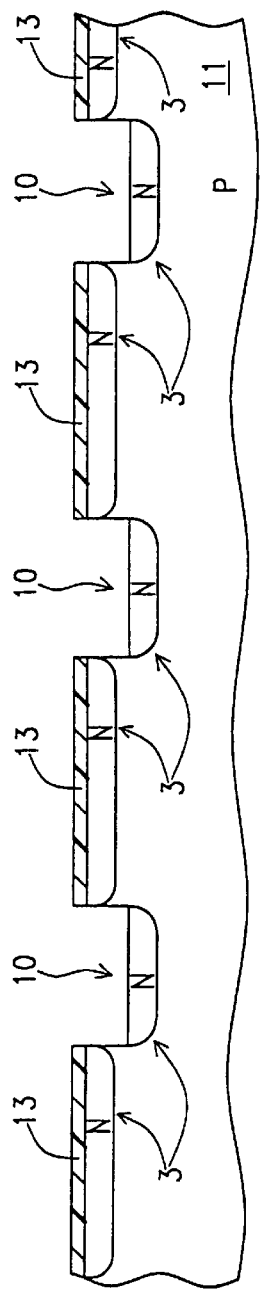
FIG. 4 shows the cross-section along line IV—IV of FIG. 1.
Figure 8:
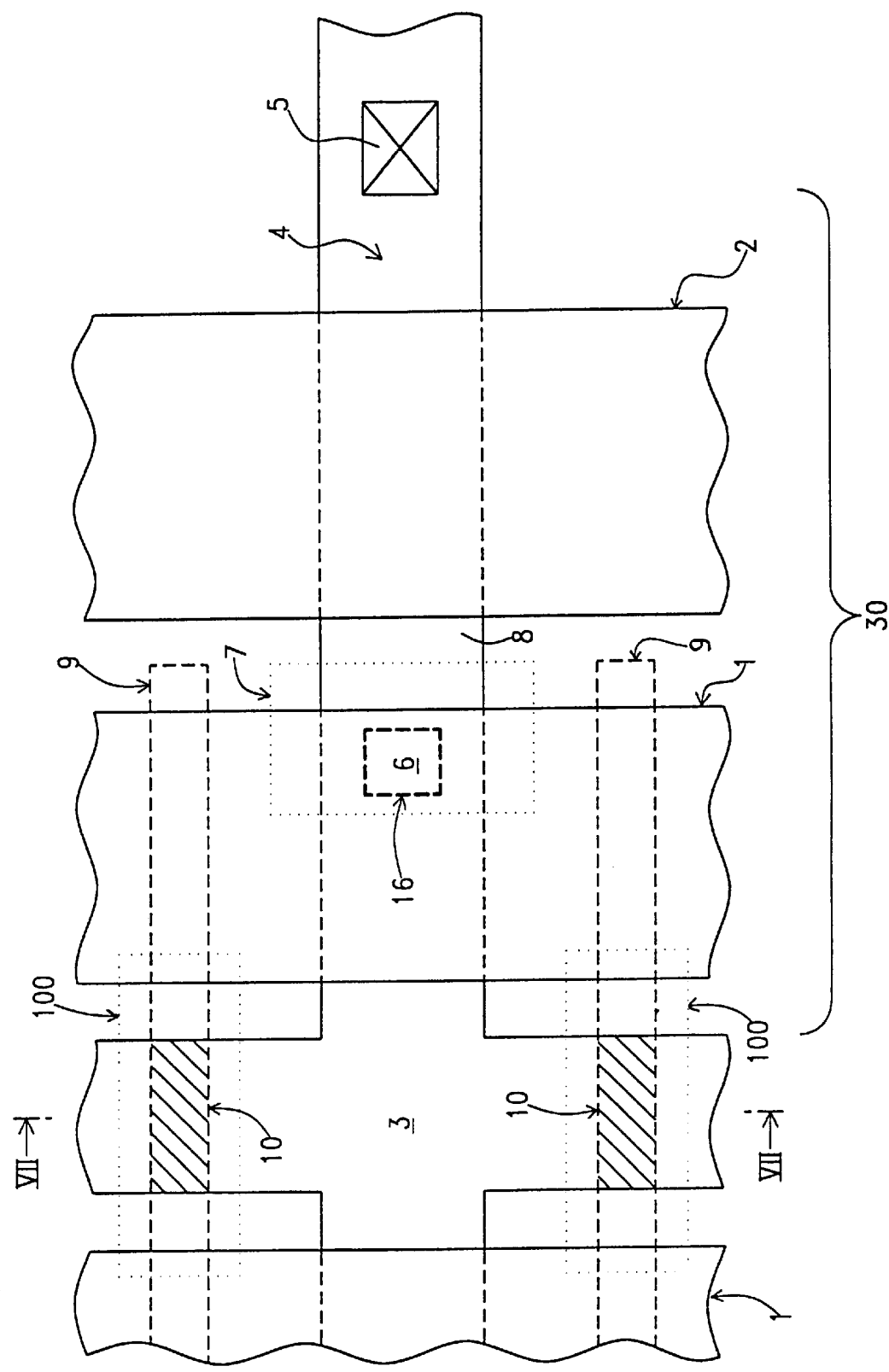
FIG. 8 shows the top-plan of the memory cell of FIG. 1, with a photolithographic mask modified according to the second embodiment of the present invention.

A second embodiment of the present invention is shown in FIG. 8, showing the same top-plan view as the one of FIG. 1, with an EEPROM memory cell and some masks of his of realization. In this case the mask containing the window 7, used for forming the type N diffusions 6 under the tunnel oxide 16, is modified so that to include other windows 100 on the zones 10 of the source regions in which the excavations will be formed: during the N type dopant implant for the formation of the diffusion 6, under the tunnel oxide 16, and before the deposition of the lower polysilicon layer 14, dopant is also implanted type N (for instance phosphorus or arsenic in a dose of about $5*10^{14}$ atomi/cm$^2$ and with an energy of about 80 KeVs) in the aforesaid zones 10, through the same photolithographic mask and through the windows 100, so to form an N type deep diffusion 101 in the zone 10 that will be subject to excavation, in analogy to what shown in FIG. 6.

As in the previous embodiment, the presence of the deep diffusions 101 will guarantee electric continuity along the common source line, in analogy to what shown in FIG. 7.

This second embodiment is particularly useful in the case of non volatile memories of the EEPROM and Flash EEPROM type, since the manufacturing process does not suffer any change, but only the geometry of the mask already used for the formation of the N type diffusions 6 under the tunnel oxide 16 is modified. In the case of non volatile memories of the EPROM type, not being instead provided the layer of tunnel oxide 16, and therefore not even the implant step to form the diffusion 6, it is still possible to form the deep diffusions in the zones 10 that will be excavated through a dedicated implant in such zones, according to the second embodiment of the invention, but in this case it will be necessary to provide a dedicated additional mask and therefore the process will include a further step.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A process for manufacturing a non-volatile memory with memory cells arranged in rows and columns in a matrix structure, with source lines extending in parallel with and intercalated to said rows, said cells comprising MOS transistors having a floating gate and a control gate respectively formed in a first and a second polysilicon layers superimposed, said process including a first step of definition of regions of active area covered by a layer of thin oxide and delimited by regions of field oxide, a second step of deposition of said first polysilicon layer, a third step of etch of said first polysilicon layer through a first mask to separate the floating gates of cells belonging to a same row of the matrix, a fourth step of deposition of an intermediate dielectric layer and of said second polysilicon layer, a fifth step of definition of said rows through self-aligned selective etch of said second polysilicon layer, of said intermediate dielectric layer and of said first polysilicon layer, said self-aligned selective etch determining in said source lines excavations in correspondence of regions in which the first polysilicon layer has been removed during said third step, and a sixth step of dopant introduction in said regions of active area for the formation of regions of source and drain of said cells, characterized in that before said fourth step a selective introduction of dopant is provided in correspondence of regions of said common source lines in which said excavations will be formed, for the formation of doped regions deeper than said excavations.

2. The process according to claim 1, wherein said selective introduction of dopant is performed after said third phase of etch of said first polysilicon layer.

3. The process according to claim 2, wherein said dopant introduction provides for an implant through a same photolithographic mask used for said etch of said first polysilicon layer.

4. The process according to claim 1, wherein said selective introduction of dopant is performed before said second step of deposition of said first polysilicon layer.

5. The process according to claim 4, wherein said selective introduction of dopant provides for a dopant implant through a photolithographic mask.

6. The process according to claim 5, further comprising the step of providing for formation of a layer of tunnel oxide under said floating gate of said memory cells, and the formation, in the regions of active area under said tunnel oxide, of deep doped regions by means of an implantation through a photolithographic mask, said photolithographic mask being also used for said selective implantation of dopant in the regions of the source lines in which said excavations will be formed.

7. Process according to claim 1, wherein said implantations and introductions are of an N type dopant.

* * * * *